United States Patent [19]

Simpson et al.

[11] Patent Number: 4,736,202
[45] Date of Patent: Apr. 5, 1988

[54] ELECTROSTATIC BINARY SWITCHING AND MEMORY DEVICES

[75] Inventors: George R. Simpson, Westport, Conn.; Herbert W. Sullivan, New York, N.Y.

[73] Assignee: Bos-Knox, Ltd., Tulsa, Okla.

[21] Appl. No.: 683,619

[22] Filed: Dec. 19, 1984

Related U.S. Application Data

[63] Continuation-in-part of Ser. No. 642,752, Aug. 21, 1984, Ser. No. 642,997, Aug. 21, 1984, abandoned, and Ser. No. 642,996, Aug. 21, 1984.

[51] Int. Cl.[4] .......................... G08B 5/36; H04Q 1/02; G02F 1/01
[52] U.S. Cl. .............................. 340/825.810; 350/266; 340/815.27; 340/783
[58] Field of Search ................... 340/815.27, 783, 763, 340/764, 825.81; 350/260, 266, 269

[56] References Cited

U.S. PATENT DOCUMENTS

| | | |
|---|---|---|
| 888,241 | 5/1908 | Kuhlmann . |
| 1,984,683 | 12/1934 | Jenkins . |
| 2,912,674 | 11/1959 | Aiken . |
| 2,952,835 | 9/1960 | Aiken . |
| 3,089,120 | 5/1963 | Aiken . |
| 3,304,549 | 2/1967 | Aiken .............................. 340/815.27 |
| 3,319,246 | 5/1967 | Aiken . |
| 3,373,422 | 3/1968 | Aiken . |
| 3,460,134 | 8/1969 | Aiken . |
| 3,543,248 | 11/1970 | Oliver .............................. 340/825.81 |
| 3,553,364 | 1/1971 | Lee . |
| 3,600,798 | 8/1971 | Lee . |
| 3,648,281 | 3/1972 | Dahms et al. . |
| 3,897,997 | 8/1975 | Kalt . |
| 3,924,228 | 12/1975 | Goodrich . |
| 3,989,357 | 11/1976 | Kalt ....................................... 350/269 |
| 4,062,009 | 12/1977 | Reverdy et al. . |
| 4,065,677 | 12/1977 | Micheron et al. . |
| 4,091,382 | 5/1978 | Anderson et al. . |
| 4,094,590 | 6/1978 | Kalt . |
| 4,099,097 | 7/1978 | Schermerhorn et al. ...... 340/825.79 |
| 4,105,294 | 8/1978 | Peck . |
| 4,160,582 | 7/1979 | Yasuo . |
| 4,160,583 | 7/1979 | Ueda . |
| 4,163,162 | 7/1979 | Micheron . |
| 4,208,103 | 6/1980 | Kalt et al. . |
| 4,229,075 | 10/1980 | Ueda et al. . |
| 4,229,732 | 10/1980 | Hartstein et al. ................... 340/764 |
| 4,233,602 | 11/1980 | Hanmura ........................ 340/825.81 |
| 4,234,245 | 11/1980 | Toda et al. . |
| 4,235,522 | 11/1980 | Simpson et al. ..................... 350/266 |
| 4,248,501 | 2/1981 | Simpson .............................. 350/260 |
| 4,266,339 | 5/1981 | Kalt . |
| 4,336,536 | 6/1982 | Kalt et al. . |
| 4,383,255 | 5/1983 | Grandjean et al. . |
| 4,402,062 | 8/1983 | Batchelder . |
| 4,468,663 | 8/1984 | Kalt . |
| 4,488,784 | 12/1984 | Kalt et al. . |
| 4,520,357 | 5/1985 | Castleberry et al. ............... 340/783 |

FOREIGN PATENT DOCUMENTS

| | | |
|---|---|---|
| 2318474 | 2/1977 | France . |
| 2402220 | 3/1979 | France . |
| 2006944 | 5/1979 | United Kingdom . |

OTHER PUBLICATIONS

Gallagher, R. T., "Microshutters Flip to Form Characters in Dot Matrix Display", Electronics (14 Jul. 1983), pp. 81, 2.

(List continued on next page.)

*Primary Examiner*—Donald J. Yusko
*Attorney, Agent, or Firm*—Davis Hoxie Faithful & Hapgood

[57] ABSTRACT

Arrays of electrostatic elements arranged in columns and rows are used for switching purposes and for memory devices. Electrostatically attracted members, for each element, when actuated, complete a capacitance device to render that element capable of retaining a charge. Whether or not the element is a capacitance device is sensed by a high frequency signal. Permanent memories can be made by substitution of a pattern of conductor areas for the attractable members. The attractable members, when attracted, form a capacitance switching device or matrix of switches.

12 Claims, 3 Drawing Sheets

OTHER PUBLICATIONS

Langner, G. O., "CRT Display Target", IBM Technical Disclosure Bulletin, vol. 13 (Aug. 1970), pp. 60 & 61.

Aiken, W. R.-"An Electrostatic Sign—The Distec System", Soc. for Information Display (Jun. 1972), pp. 108, 9.

Bruneel et al., "Optical Display Device Using Bistable Electrets", Appl. Phys. Lett., vol. 30, No. 8 (15 Apr. 1977), pp. 382, 383.

Petersen, K. E.-"Micromechanical Membrane Switches on Silicon", IBM J. Res. Develop., vol. 23, No. 4, (Jul. 1979), pp. 376-384.

Vuilleumier, R. et al.-"A Novel Electromechanical Microshutter Display" (9/27/83).

Langner, G. O.-"Light Gating Brightens CRT Image for Large Projection Displays", Electronics (Dec. 7, 1970), pp. 78-83.

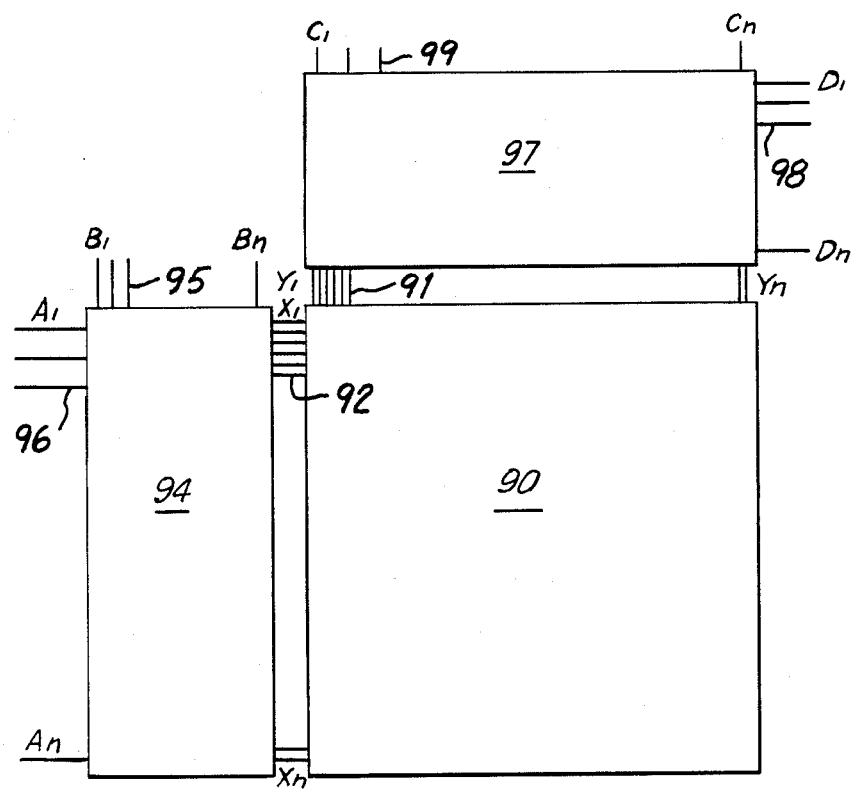
FIG. 4
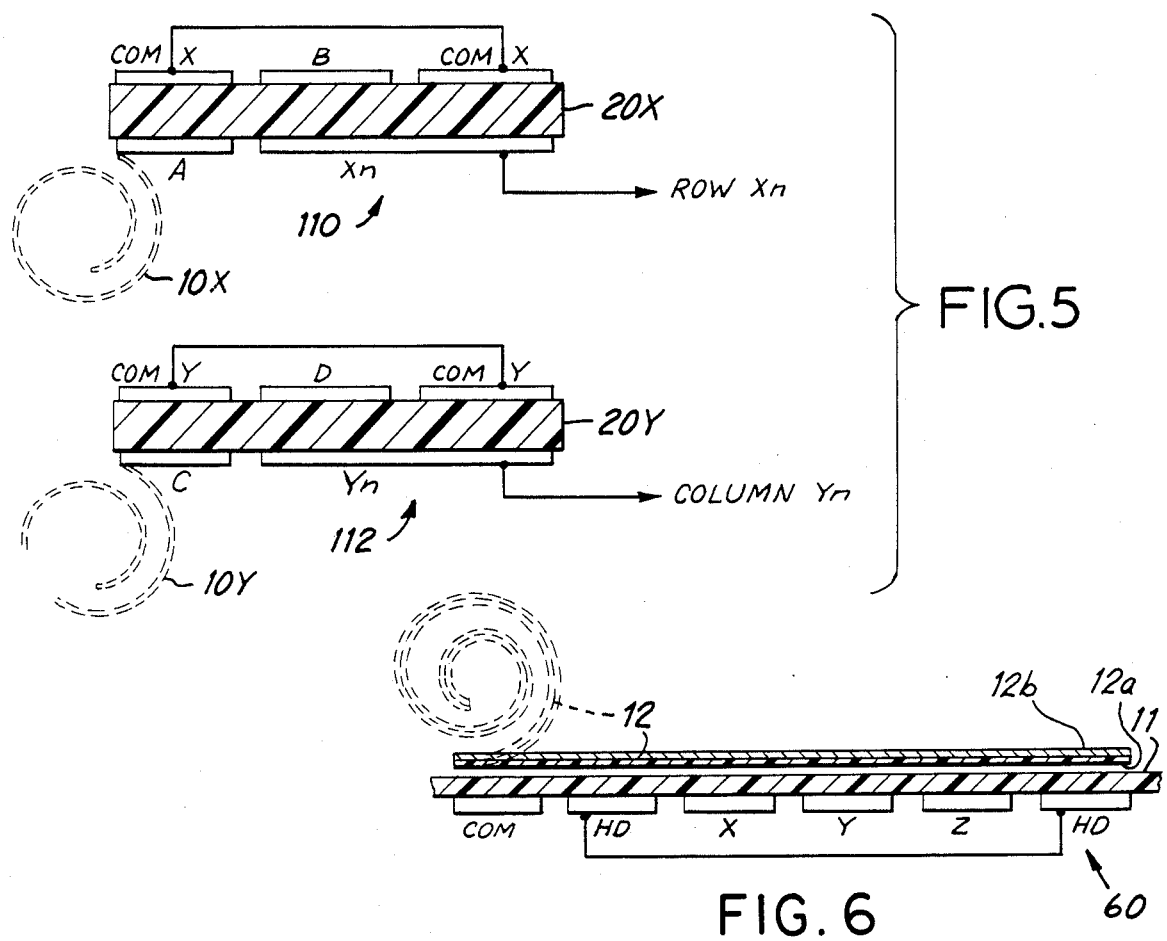
FIG. 5
FIG. 6

ELECTROSTATIC BINARY SWITCHING AND MEMORY DEVICES

This application is a continuation-in-part of our application Ser. No. 642,752, filed Aug. 21, 1984, for an "Array of Electrostatically Actuated Binary Devices", application Ser. No. 642,997, abandoned, filed Aug. 21, 1984, for an "Array of Electrostatically Actuated Binary Devices and Methods of Manufacture", and application Ser. No. 642,996, filed Aug. 21, 1984, for an "Array of Electrostatically Actuated Binary Shutter Devices."

BACKGROUND OF THE INVENTION

This invention relates to electrostatically controllable electromechanical binary devices for use as an array, switching matrices, memories and the like.

The prior art contains various examples of electrostatic display elements. One type of device such as is shown in U.S. Pat. Nos. 1,984,683 and 3,553,364 includes light valves having flaps extending parallel with the approaching light, with each flap electrostatically divertable to an oblique angle across the light path for either a transmissive or reflective display. U.S. Pat. No. 3,897,997 discloses an electrode which is electrostatically wrapped about a curved fixed electrode to affect the light reflective character of the fixed electrode. Further prior art such as is described in ELECTRONICS, Dec. 7, 1970, pp. 78-83 and I.B.M. Technical Disclosure Bulletin, Vol. 13, No. 3, August 1970, uses an electron gun to electrostatically charge selected portions of a deformable material and thereby alter its light transmissive or reflective properties.

Additional instruction in the area of electrostatically controlled elements useable for display purposes can be gained from the following U.S. Pat. Nos.: 4,336,536, Kalt et al; 4,266,339, Kalt; 4,234,245, Toda et al; 4,229,075, Ueda et al; 4,208,103, Kalt et al; 4,160,583, Ueda et al; 4,160,582, Yasuo; 4,105,294, Peck; 4,094,590, Kalt; 4,065,677, Micheron et al; 3,989,357, Kalt; 3,897,997, Kalt; and, 888,241 Kuhlmann.

The present invention proceeds from material disclosed in Simpson U.S. Pat. No. 4,248,501, and Simpson et al U.S. Pat. No. 4,235,522.

Of background interest are:

W. R. Aiken: "An Electrostatic Sign-The Distec System", Society for Information Display June 1972, pp. 108-9;

J. L. Bruneel et al: "Optical Display Device Using Bistable Elements", Applied Physics Letters, vol. 30, no. 8, Apr. 15, 1977, pp. 382-3, and R. T. Gallagher: "Microshutters Flip to Form Characters in Dot-Matrix Display", Electronics, July 14, 1983, pp. 81-2.

SUMMARY OF THE INVENTION

The present invention provides an electrostatic device for memories, switching matrices, and the like. The device takes the form of an array of electrostatic binary elements each having a plurality of electrode regions connected in columns and rows for addressing of a particular element with appropriate drive voltages to electrostatically change the state of the element. When actuated, the element forms a capacitor. The presence or absence of capacitance allows the status of the array to be "read" using a high frequency or pulse signal to determine which elements act like capacitors. The ability of the elements to change state from capacitor to non-capacitor permits use of the arrays as switching devices to deliver a signal pulse when actuated. Such switching matrices or arrays can be used to control a further array.

Simpson U.S. Pat. No. 4,248,501, Simpson et al U.S. Pat. No. 4,235,522, and Simpson et al U.S. applications Ser. No. 642,752, Ser. No. 642,997, and Ser. No. 642,996 show a variety of configurations of electrostatically actuated binary elements in which a flexible flap, curl, or shutter is driven between two positions or states by appropriate energization of electrode areas. Arrays of columns and rows of these binary elements are disclosed in which elements are addressed individually to change state for such purposes as alpha-numeric displays. The various elements disclosed in the above patents and applications are suitable for use as the binary elements of the present invention and those several disclosures are incorporated herein by reference. The present disclosure illustrates and describes a suitable generalized form of electrostatic binary element capable of execution in accordance with specific embodiments found in any of the above disclosures.

BRIEF DESCRIPTION OF DRAWINGS

FIG. 4 is a schematic showing two switching arrays controlling a primary array.

FIG. 5 is a schematic, cross-sectional view of binary elements suitable for use as capacitive switch elements.

FIG. 6 is a schematic, cross-sectional view of a further embodiment of a binary element.

DETAILED DESCRIPTION

Figure 1:
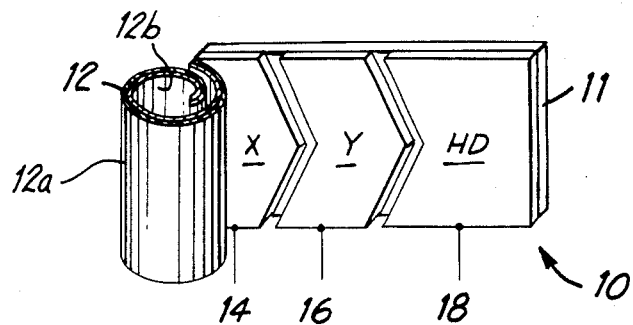
FIG. 1 is a perspective view of a binary element suitable for use in the present invention.

FIG. 1 is a schematic representation of a simplified single binary electrostatic element 10 having X, Y and latching or hold-down (HD) electrodes separated by gaps of chevron shape on a stator 11 and an electrostatically attractable flap 12 for example, a dielectric film 12a with a conductive coating 12b, shown in the form of a curl. Energization of the X electrode region will cause the flap 12 to uncurl partially. Energization of the Y electrode region will cause further uncurling and energization of the latch electrode region HD will complete uncurling and flattening of the flap 12. The drive voltages for the X and Y electrode regions can be extinguished and the flap will remain flattened so long as the latch electrode HD remains energized.

Figure 2:
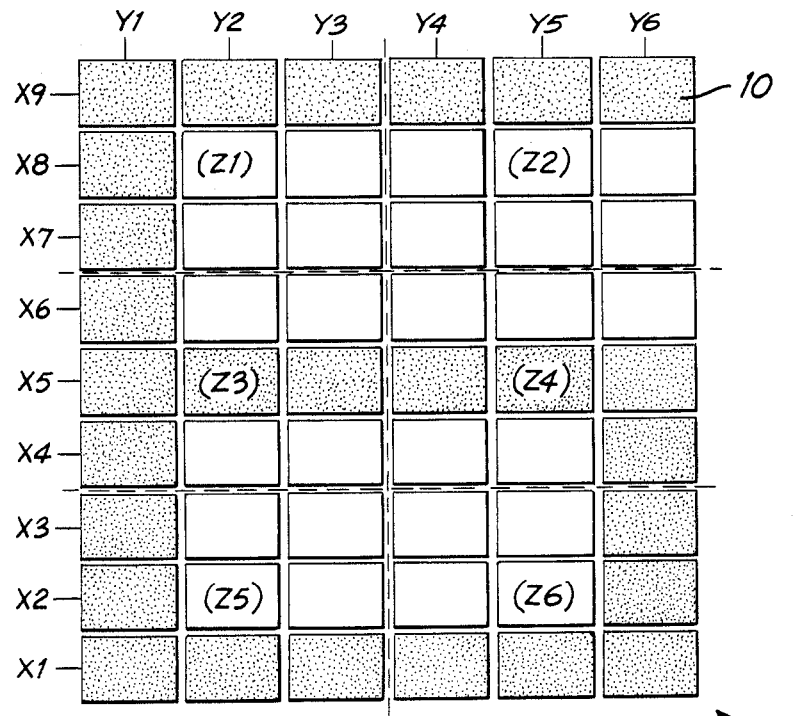
FIG. 2 is a schematic representation of an array of binary elements.

FIG. 2 is a small six by nine element array 20 of fifty four binary elements or pixels, some of which are actuated to form a visual character, in this case, the number "6". Actuation of the selected elements is achieved by providing a drive voltage to the X and Y electrode regions of the element at a particular address in the array. All X regions of each row are electrically connected together and to an X input (lead 14) for that row. All Y regions in each column are connected together and to a Y input (lead 16) for that column. Thus, to form the left side of the character "6", the column input lead Y1 and row input leads X1 through X9 are energized sequentially. Similarly, to form the right side of the character, column input lead Y6 and row input leads X1 through X5 and X9 are energized sequentially. Each selected element or pixel addressed changes state and is latched in that changed state by energization of all latch electrodes HD in the array by input lead 18. Each pixel 10 has a discrete address such as X9, Y6. Consequently, the number of external switching devices and leads required to control the small array of FIG. 2 is 9X inputs plus 6Y inputs plus one hold-down input for a total of sixteen inputs to be switched.

The number of X, Y input leads or external switching devices required to control 389,376 pixels in an array 576 by 676 is 1252 plus hold-down inputs. The number of switching devices for an array is given by:

$$S = d\sqrt[d]{N}$$

where S is the minimum siwtch number, N is the number of pixels, and d is the number of mathematical array dimensions, for example d equals 2 for an X, Y array and 3 for an X, Y, Z array. In this two dimensional array, $$S = 2\sqrt[2]{389,376} = 1248$$

external switching devices.

Figure 3:
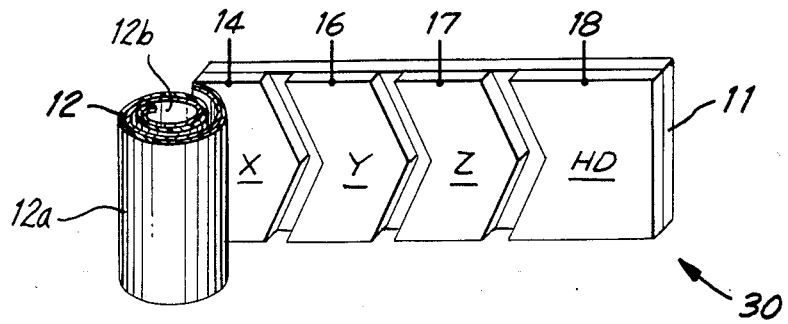
FIG. 3 is a perspective view of a further embodiment of a binary element.

One way to reduce the number of external switching devices required to control an array is to increase the number of dimensions of the array. If an X, Y array is considered to be two dimensional, then an X, Y, Z array is three dimensional. FIG. 3 shows a binary element 30 similar to element 10 of FIG. 1, but having a Z electrode region and lead 17 as well. The Z electrode regions of a group of elements in an array are connected together. In FIG. 2 six Z groups (Z1 through Z6) are indicated as groups of 9 pixels bounded by dashed lines. The address of a particular element, 10 for example, becomes X9, Y6, Z2. For a three dimensional array of 389,376 pixels, the number becomes $S = 3\sqrt[3]{389,376} = 220$ external switching devices or roughly one-fifth the number required for a two dimensional array of the same number of pixels.

Another manner in which the number of external switching devices required to control an array of a large number of elements or pixels is the use of switching arrays in advance of the X and the Y leads of the pixel array. FIG. 4 is a schematic diagram showing a pixel array 90, for example 576 by 676, which has 576 X leads 92 and 676 Y leads 91 for a total of 1252 leads. A switching array 94 for the X leads and a switching array 97 for the Y leads are shown. To control the 576 leads, the switching array 94 requires $2\sqrt{576} = 48$ leads which can be distributed as 24 "A" leads 95 and 24 "B" leads 96. Similarly, the 676 Y leads can be controlled by a Y switching array 97 having $2\sqrt{676} = 52$ leads distributed as 26 "C" leads 98 and 26 "D" leads 99. By use of switching arrays, the number of external leads to be switched externally becomes 48+52=100 instead of 1252.

Address of a particular pixel, say X=250, Y=330, requires address of the proper A lead and B lead of the X switching array, and address of the proper C lead and D lead of the Y array. The address of the selected pixel (X=250; Y=330) becomes instead (A, B); (C, D) where A, B, C, and D are variables determined by the matrices of the X and Y switching arrays.

The great reduction in the number of external leads (100 instead of 1252 in this example) very considerably reduces the hardware costs of controlling a large number array. Because two switching arrays must respond before the pixel array is actuated, speed of response is reduced.

FIG. 5 is a schematic showing how electrostatically actuated elements can be used as capacitance switching devices suitable for use in the X and Y switching arrays 94 and 97. Since the switching devices are electrostatic elements similar to the pixel elements, they can be formed, for example, at the margins of the pixel display array 90 at the same time and by the same photo-etching or printing techniques as the display pixels are formed. The X and Y leads from the display directly connect with the X and Y switching arrays and are formed as a part of the photo-etch or printing process. Consequently, it is only the far fewer leads for address of the X and Y switching arrays that require external connections.

The schematic of FIG. 5 shows a pixel 110 of the X switching array and a pixel 112 of the Y switching array. The pixels of these X and Y switching arrays are not necessarily visual display elements, but are electrostatically actuated capacitance switch elements. The electrostatically attracted flaps 10X and 10Y are suggested in the curled state by dashed lines and in the actuated or flattened state by their respective conductive regions A, Xn and C, Yn. The stators, 20X and 20Y have conductive regions, respectively, COM X, B, COM X, and COM Y, D, COM Y.

The stator common electrode regions COM X are connected together as are the regions COM Y and connected to a source of alternating current. The provision of an alternating current to the appropriate row of the X switching array 94 will energize all A regions of the flaps 10X in that row, and to the appropriate column will energize all the B regions of the stators in that column. In this example, the capacitance switching pixel lying at the row, column intersection is the depicted pixel 110. It is the only pixel in the X switching array which actuates, and when actuated, electrode region Xn becomes capacitively charged and thereby produces an output signal which drives row Xn (the desired row) of the display array 90. Similarly, capacitive switching pixel 112 of the Y switching array 97 actuates to provide at electrode Yn a drive signal to the selected column Yn of the display array.

The concurrence of the drive signal Xn, Yn (the output of the X and Y switching arrays) causes actuation of the target pixel of the display array. Thus, display pixel Xn, Yn is addressed by addressing X switching pixel 110 (A, B) and Y switching pixel 112 (C, D), where A, B, C, D are address components representing the selected columns and rows of the two switching arrays and thereby represent independent address components of the target pixel of the large display array. In this manner, the number of external switching devices required to control the display array is greatly reduced as described above in connection with FIG. 4.

Cascading of switching arrays can be continued further and further to reduce the number of external leads. This technique gains in utility as the number of pixels in the display array increases. For example, a large area display array can, with triads of color pixels, become a flat, very thin television screen of unlimited size. Limitations of the number of the triads are imposed, not by the technology, but by the broadcast signal standards. Cascaded marginal switching arrays permit a cable connection of a realistic number of wires to the signal generator, TV receiver, or video recorder.

Lead reduction also is accomplished by use of three or more dimension arrays wherein each element has electrode regions for X, Y, Z ... N drive inputs. See our U.S. Pat. No. 4,235,522, column 6 et seq. Combinations of capacitive switching arrays and three or more mathematical dimension arrays can significantly reduce the external leads and discrete components required. Using three two dimensional switching arrays to drive a single three dimensional array is the equivalent of a six dimensional array. Thus, the 100 leads required for the 389,376 pixel array as described above can control $(100/6)^6$ = over 21 million pixels when this combination technique is employed to achieve a six dimensional array.

FIG. 6 is a schematic, sectional view of a binary element 60 similar to those of FIGS. 1 and 3 wherein the moveable electrode 12 is in the form of a curl electrostatically attracted into an uncurled or flattened state overlying a stator 11 of dielectric material having a plurality of stator electrode regions COM, HD, X, Y, Z, and HD. The flap 12 is shown curled in dashed lines and flattened in solid lines. It has at least a conductive surface 12b such as aluminum vapor deposited on a film 12a such as polyethylene terephthalate. That conductive surface is not directly electrically connected, but is free to float electrically. The element is addressed and actuated into the flattened state by applying an electrical potential between the several stator electrode regions. Once flattened, the flat 12 will remain latched in the flattened or actuated state by virtue of the continuance of potential at the latch or hold-down electrode region HD. Once flattened, the drive potential to the X, Y, and Z electrodes is extinguished. Selected flattened flaps can be driven to the curled state by an appropriate sequence of electrode switching as is taught in our application Ser. No. 642,752.

To prevent loss of memory during a power interruption, the latching or hold-down electrodes HD can be electrets, that is a material, such as polythylene terphthalate, capable of permanent retention of electrostatic charge. The conductive electrode regions of the latching or hold-down electrodes allow the permanent charge of the electret to be overcome for actuation purposes. The status of each element will be preserved by the latching effect of the electret in the absence of electrical power.

The subject matter thus far disclosed essentially is an array or a field of binary latchable gating elements, either curled or flattened, either reflective of light or not, either a hole or not. Similar arrays can be used as a memory for computer purposes. Once programmed so that selected elements are capable of being uncurled, and the other elements are not capable of uncurling, it is a memory.

An array of elements having some capable of being actuated and some not can serve as a memory. In order to read the memory, each element in the array is provided with the drive sequence to cause overlying, if the element is capable of overlying. To ascertain whether or not the element overlies the stator, a signal pulse is directed to one electrode of that element and the other electrodes of that element are connected to a signal detector. If the stator is overlain, the signal will be detected by virtue of the capacitive coupling only available where the stator is overlain.

Figure 7:
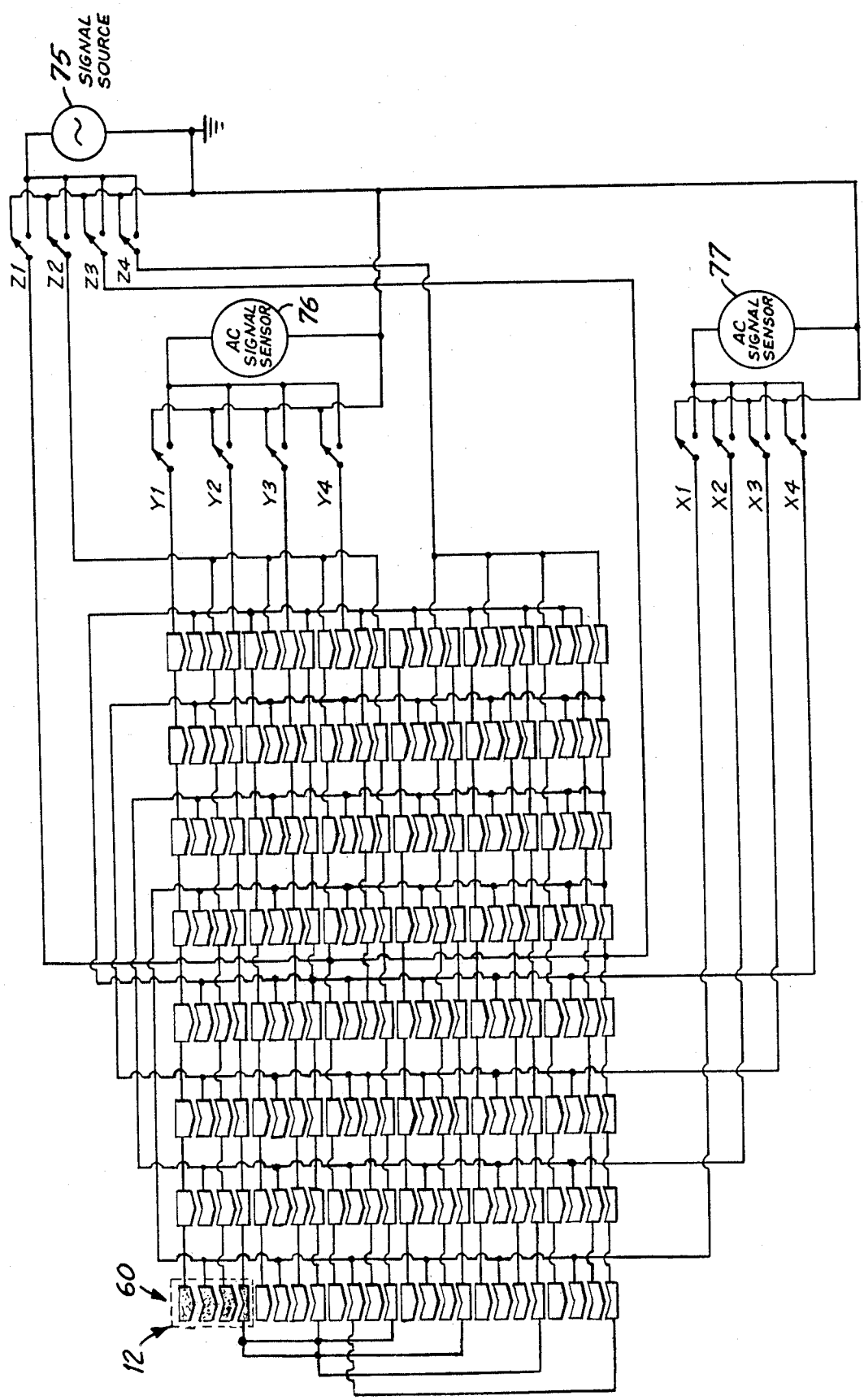
FIG. 7 is a circuit schematic of a capacitive memory using the binary elements of the present invention.

FIG. 7 is an array of 64 elements arranged as a three dimensional X, Y, Z array 4 by 4 by 4. For clarity, only the X, Y, and Z electrode regions are shown. The floating conductor or flap 12 is shown in dashed lines for the upper left hand element 60 having an address of X1, Y1, Z1.

The fact that only one element 60 has been actuated can be ascertained by providing a high frequency signal or pulse source 75 switchable among any of Z1 through Z4, a first signal sensor 76 switchable among any of Y1 through Y4, and a second signal 77 sensor switchable among any of X1 through X4. Only when the signal source 75 is switched to Z1 will it encounter a capacitor (element 60). The signal will capacitively couple to Y1 and to X1 and can be sensed by the sensors 76, 77 only when they are switched respectively to Y1 and X1. Thereby, the fact that element 60 has been actuated can be detected and the address resolved into X1, Y1, Z1.

Information is stored in the memory array in terms of the presence or absence of the capability of becoming a capacitor at each intersection of the columns and rows of the array. Analog values of charge are not measured, only a binary presence or absence, thereby providing a stable, reliable memory, less sensitive to electrical noise or random signals, or frequency bandwidth problems.

The array of FIG. 7 can be manufactured by photoetching or printing techniques on a plurality of substrate films which are later laminated. The conductor leads for each electrode region are arranged in planes to prevent unwanted interconnections. Where a conductor lead for one electrode region passes over a lead for another region a further plane having a grounded conductive surface serves as an isolation shield to prevent signals from straying to the wrong lead. The seeming circuit complexity resolves into several layers of printed or photo-etched "art work" capable of low cost manufacture. Arrays of hundreds of thousands of elements can be produced in an area only a few centimeters square. Not only is the cost of the array small (only printing on film) but the number of external connections and switching devices is small, thereby reducing the over-all cost of the computer or other application hardware.

What is claimed is:

1. A method of operating a memory device, the device comprising an array of electrostatically actuated binary elements electrically connected in columns and rows, each element comprising an electrostatically attractable element having at least a conductive surface and a stator member having plural electrode regions, said attractable member, when actuated, overlying said stator member and being separated therefrom by a dielectric material, the method comprising the steps of:
  (a) actuating a selected element of the array by providing an electrical potential to electrode regions of that element to thereby electrostatically attract the attractable member to overlie the stator member,
  (b) ascertaining whether an element has been actuated by directing a signal to one of the electrode regions of that element, and
  (c) sensing the presence of said signal by connecting a signal sensor to another electrode region of that element, the signal being capable of being sensed only when the attractable member of that element capacitatively couples said electrode regions.

2. A memory device comprising an array of electrostatically actuated binary elements electrically connected in columns and rows, each element comprising an electrostatically attractable element having at least a conductive surface and a stator member having plural electrode regions, said attractable member, when actuated, overlying said stator member and being separated therefrom by a dielectric material to thereby be capable of acting as a capacitive memory element, and means for detecting the capacitances of the elements, whereby the capacitances of each element of the array collectively indicate the information stored in the memory.

3. The memory device of claim 2 wherein the electrostatically attractable member is a flexible flap.

4. The memory device of claim 3 wherein the flap has a permanent mechanical bias away from the stator member.

5. The memory device of claim 4 wherein the flap is biased to curl when not actuated.

6. The memory device of claims 2 or 5 wherein a first electrode region of each of the elements in a row of the array are connected together and to an input lead for that row, and a second electrode region of each of the elements in a column of the array are connected together and to an input lead for that column.

7. The memory device of claim 6 wherein a third electrode region of each of the elements in a group of elements within the array are connected together and to an input lead for that group.

8. A memory device comprising an array of elements electrically connected in columns and rows, each element in the array having at least first and second electrode regions and a memory electrode area, the first electrode region of each element in a column of the array being connected together and to an input lead for that column, the second electrode region of each element in a row of the array being connected together and to an input lead for that row, the first and second electrode regions of each element being separated by a dielectric material from the memory electrode area for that element, and means for electrically detecting the presence or absence of conductive material overlying the memory electrode area.

9. The memory device of claim 8 wherein the conductive material for the electrode area comprises an electrostatically attractable member having at least a conductive surface.

10. A binary device comprising;
an array of electrostatically actuated binary elements, each element comprising a stator member, an electrostatically attractable member, and a plurality of electrode regions which, when energized, electrostatically attract the attractable member toward the stator member, a first electrode region of each binary element being connected in a primary array of rows and columns, a second electrode region of each binary element being connected in a first switching array of rows and columns, and a third electrode region of each binary element being connected in a second switching array of rows and columns, each element being actuated in the primary array by the concurrence of a drive voltage for the column with a drive voltage for the row at the intersection of which the region is located, the drive voltage for the column of the primary array being controlled by the first switching array of binary elements, each region of the first switching array being actuated by the concurrence of a drive voltage for the column with a drive voltage for the row at the intersection of which the region is located, and the drive voltage for the row of the primary array being controlled by the second switching array of binary elements, each element of the second switching array being actuated by the concurrence of a drive voltage for the column with a drive voltage for the row at the intersection of which the second switching array element is located.

11. The device of claim 10 wherein actuation of the elements of the primary array requires the additional concurrence of a third drive voltage, the third drive voltage being controlled by a third switching array of binary elements, each element of which is actuated by the concurrence of a drive voltage for the column with a drive voltage for the row at the intersection of which the third switching array element is located.

12. The device of claim 10 wherein the elements of the switching arrays comprise a stator member having a plurality of electrode regions and a flap member having a plurality of electrode regions, energization of certain of the electrode regions causing the flap to overlie the stator member to thereby form a capacitor through which a drive signal will pass to the primary array.

* * * * *